(12) United States Patent
Scabarozi

(10) Patent No.: US 9,702,921 B2
(45) Date of Patent: Jul. 11, 2017

(54) MULTI-PURPOSE TOOL FOR BLADE FUSES

(71) Applicant: Dustin Scabarozi, Cocoa Beach, FL (US)

(72) Inventor: Dustin Scabarozi, Cocoa Beach, FL (US)

(*) Notice: Subject to any disclaimer, the term of this patent is extended or adjusted under 35 U.S.C. 154(b) by 0 days.

(21) Appl. No.: 14/937,760

(22) Filed: Nov. 10, 2015

(65) Prior Publication Data

US 2016/0131695 A1    May 12, 2016

Related U.S. Application Data

(60) Provisional application No. 62/078,262, filed on Nov. 11, 2014.

(51) Int. Cl.
| | | |
|---|---|---|
| *G01R 31/07* | (2006.01) | |
| *H01H 85/02* | (2006.01) | |
| *B25B 9/02* | (2006.01) | |
| *G01R 31/02* | (2006.01) | |
| *B08B 1/00* | (2006.01) | |

(52) U.S. Cl.
CPC ............. *G01R 31/07* (2013.01); *B25B 9/02* (2013.01); *G01R 31/026* (2013.01); *H01H 85/0208* (2013.01); *B08B 1/005* (2013.01)

(58) Field of Classification Search
CPC ... G01R 31/07; G01R 31/026; H01H 85/0208
USPC .............................. 324/550; 81/3.8; 294/174
See application file for complete search history.

(56) References Cited

U.S. PATENT DOCUMENTS

| | | | |
|---|---|---|---|
| 1,252,964 A | | 1/1918 | Stafford |
| 1,389,651 A | | 9/1921 | Gonder |
| 1,989,645 A | * | 1/1935 | Podell ..................... G01R 31/07 324/550 |
| 2,023,916 A | * | 12/1935 | Dante ................ H01H 85/0208 324/550 |
| 2,076,998 A | | 4/1937 | Martindale |
| 2,236,941 A | | 4/1941 | Foley |
| 2,471,236 A | | 5/1949 | Parker |
| 2,734,320 A | | 2/1956 | Hoye |
| 3,879,778 A | * | 4/1975 | Archer ............... H01H 85/0208 |
| 4,314,383 A | * | 2/1982 | Epstein |
| 4,414,698 A | * | 11/1983 | Epstein |
| 4,475,283 A | * | 10/1984 | Olson |
| 4,525,664 A | * | 6/1985 | Trammell, Jr. ...... G01R 31/026 |
| 4,541,311 A | | 9/1985 | Trammell |
| 4,841,819 A | | 6/1989 | Williams |
| 5,148,572 A | | 9/1992 | Wells |
| 5,201,093 A | | 4/1993 | Wells |
| 5,267,493 A | | 12/1993 | Yamagata |
| 5,446,388 A | * | 8/1995 | Chick .................... G01R 31/07 |
| 5,666,865 A | | 9/1997 | Ito |

(Continued)

*Primary Examiner* — Walter L Lindsay, Jr.
*Assistant Examiner* — Milton Gonzalez
(74) *Attorney, Agent, or Firm* — Alan Cote; Green Mountain Innovations

(57) ABSTRACT

A multi-purpose tool singularly provides all functions necessary to remove a blade-type fuse, clean the male blades of a fuse, and clean contact points of a female fuse receptacle. The tool also may provide a battery-powered circuit to check the continuity of a fuse. The tool includes a pair of abrasive tabs for cleaning female fuse receptacles, a slot with at least one abrasive surface for cleaning male fuse blades, and a pair of picking arms for grasping a fuse.

19 Claims, 8 Drawing Sheets

(56) References Cited

U.S. PATENT DOCUMENTS

| | | |
|---|---|---|
| 5,751,208 A | 5/1998 | Martinez |
| 5,800,043 A * | 9/1998 | Walkerow |
| 6,871,567 B2 | 3/2005 | Pinana Lopez |
| 2009/0088026 A1 | 4/2009 | Furuya |
| 2011/0290278 A1 | 12/2011 | Swayne |
| 2012/0187006 A1 | 7/2012 | Swayne |
| 2013/0033269 A1* | 2/2013 | He .................. G01R 31/07 324/550 |

* cited by examiner

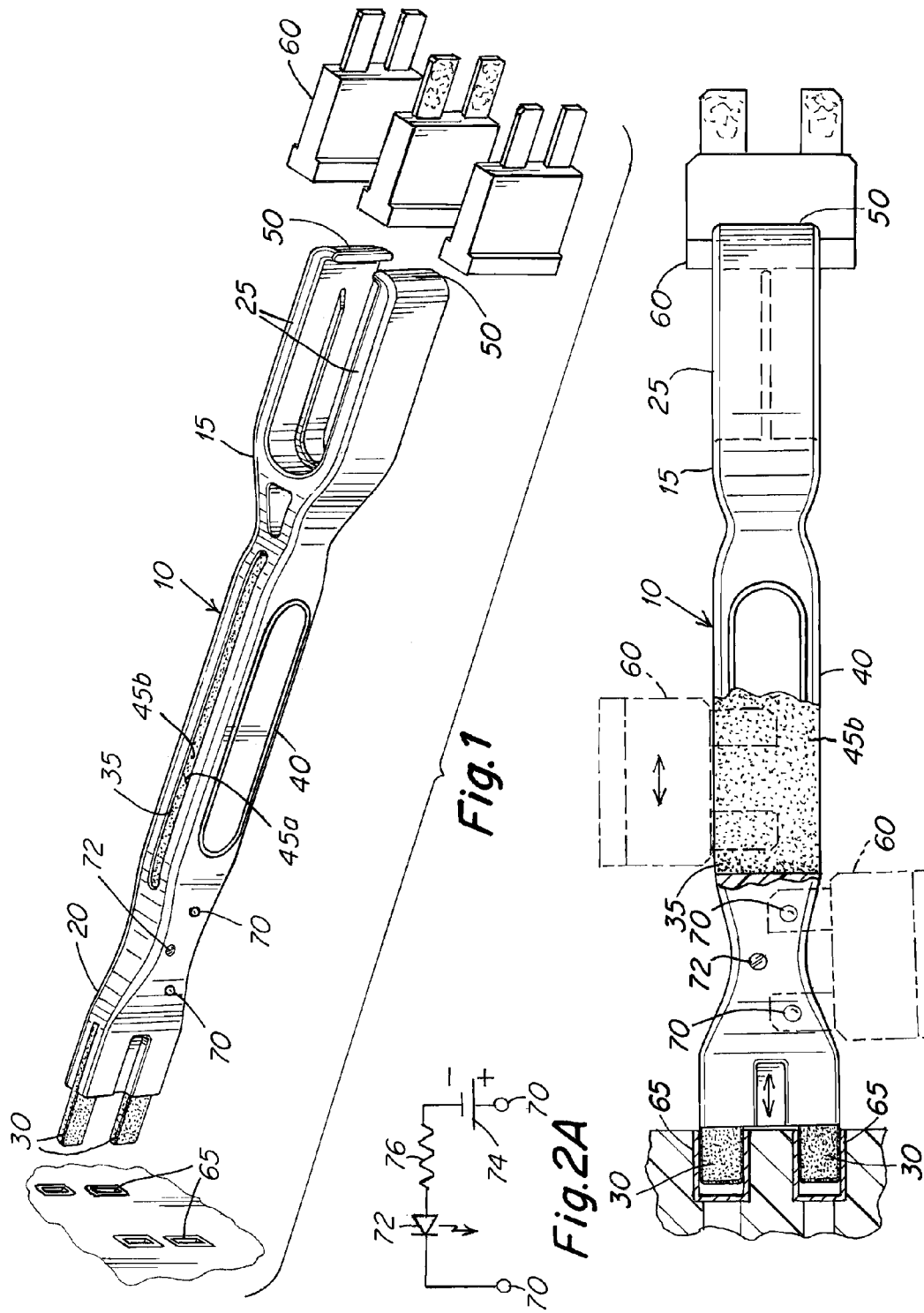

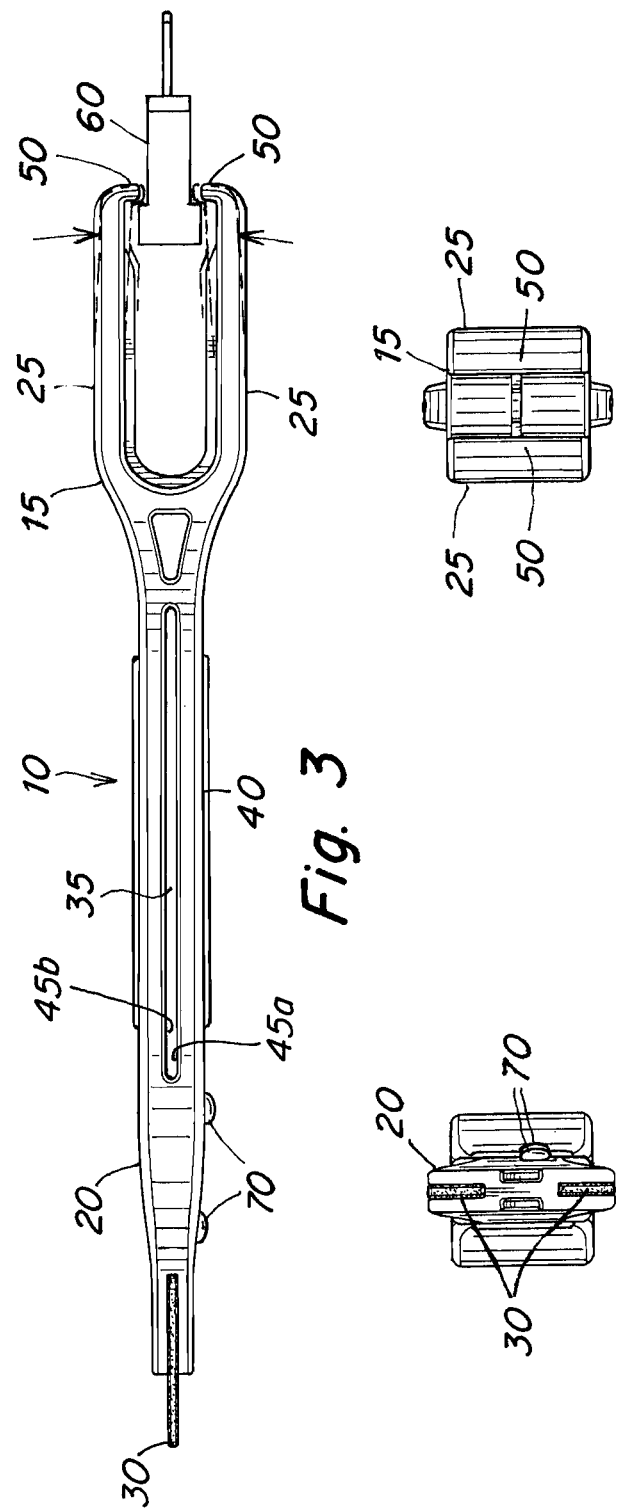

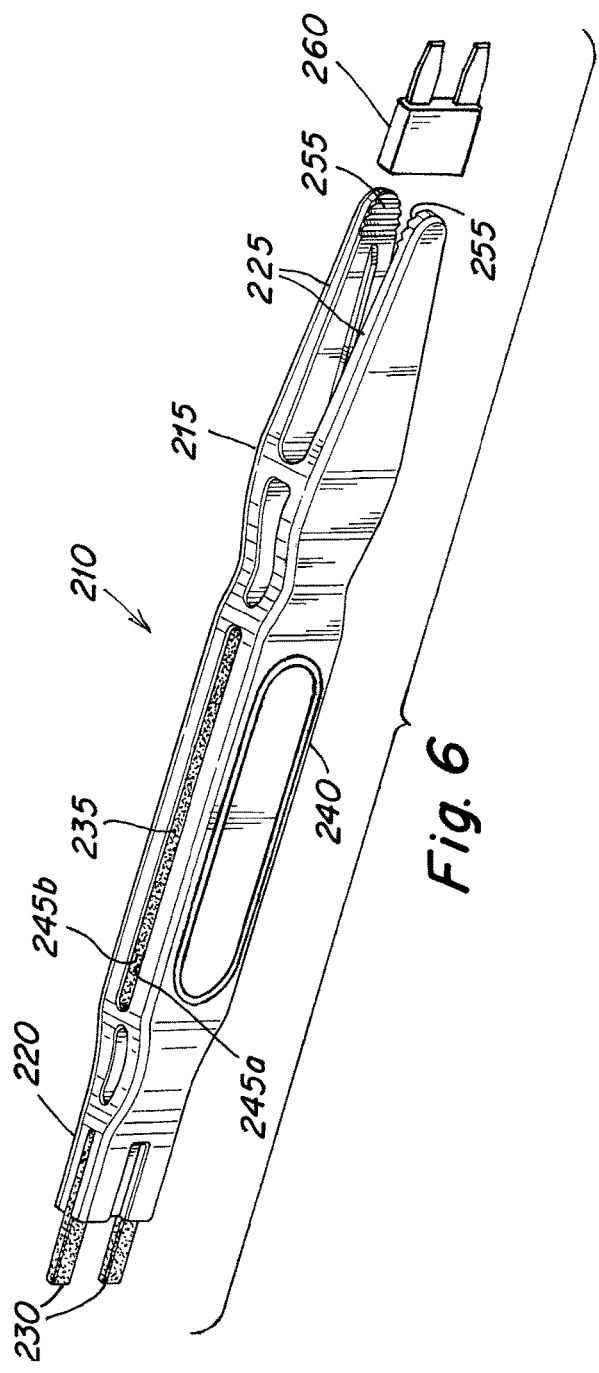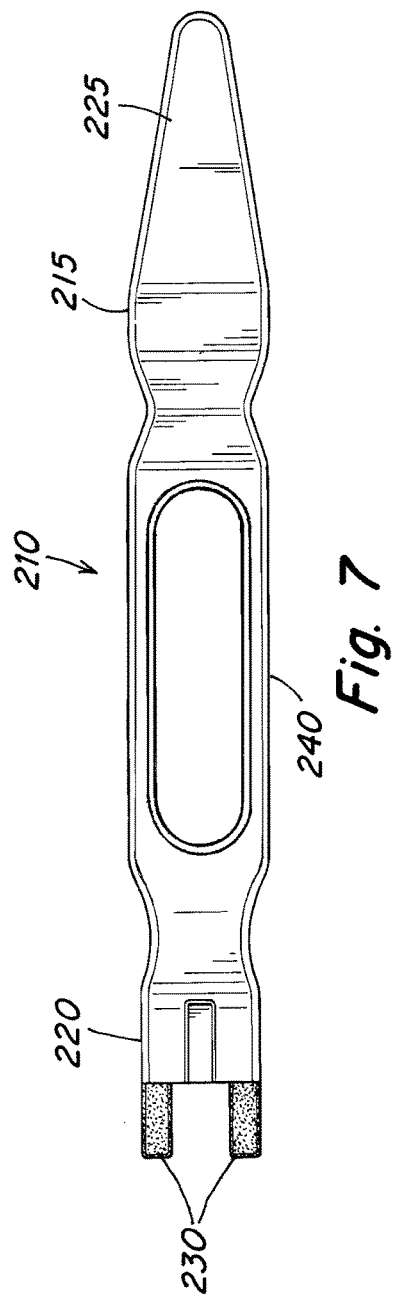

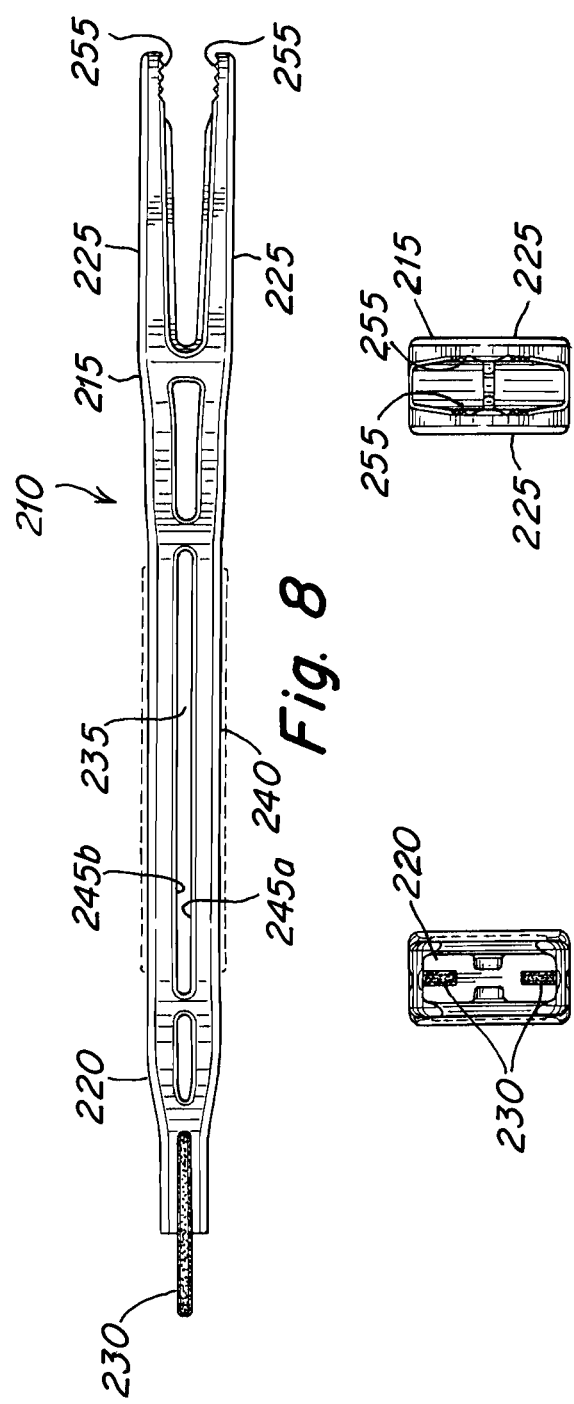

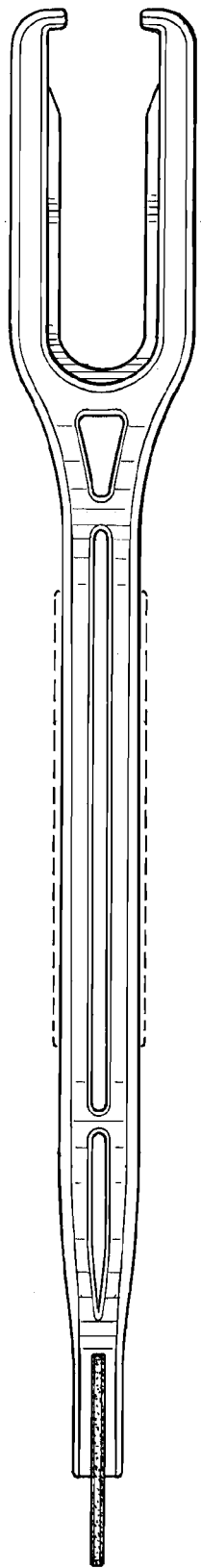
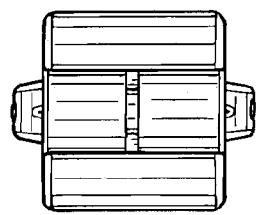
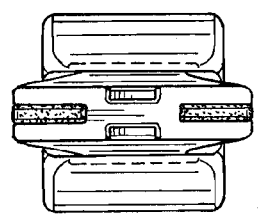
Fig. 13
Fig. 14
Fig. 15

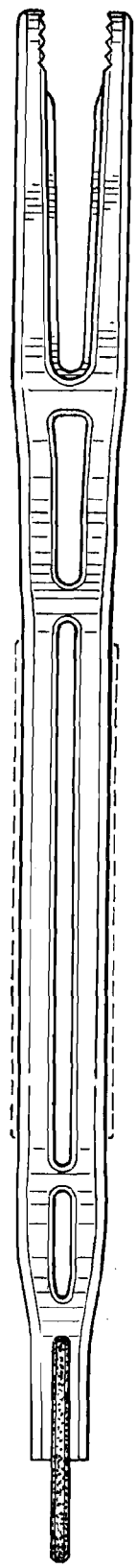
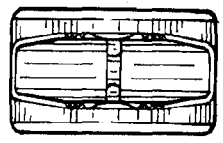
Fig. 18
Fig. 19
Fig. 20

MULTI-PURPOSE TOOL FOR BLADE FUSES

CROSS-REFERENCE TO RELATED APPLICATION

This application claims priority to U.S. Provisional Application No. 62/078,262; filed Nov. 11, 2014

FEDERALLY-SPONSORED RESEARCH

None

BACKGROUND

Field of the Invention

The present disclosure relates to the field of tools used for electrical fuses; specifically blade-type fuses. Electrical fuses can be difficult to remove from their female receptacles due to, for example, the often-tight spacing between fuses arranged in a fuse box. Human fingers may not be able to adequately grasp a fuse and pull it from its receptacle. Common tools such as needle nose pliers may also not readily grasp a fuse securely enough to allow for easy removal.

Additionally, there may be corrosion or oxidation that builds up on the surfaces that are in electrical contact between a fuse and its fuse receptacle. Such corrosion may unwantedly increase electrical resistance or cause discontinuity. Cleaning such corrosion via light abrading is therefore desirable in order to maintain the function of the related electrical circuit. In addition, being able to easily check the electrical continuity of a fuse is also desirable.

Therefore, what is needed is a single tool that can perform some or all of the above functions.

BRIEF SUMMARY OF THE INVENTION

The present disclosure describes a multi-purpose tool which singularly provides a user all functions necessary to remove a blade-type electrical fuse, clean the male blades of the fuse, and clean contact points of the female fuse receptacle. The tool also may provide a battery-powered circuit to check the continuity of a fuse. The tool includes a pair of abrasive tabs for cleaning female fuse receptacles, a slot with at least one abrasive surface for cleaning male fuse blades, and a pair of picking arms for grasping a fuse.

In one embodiment there is a tool for fuses and fuse contacts which includes: a body, with a set of picking arms at a first end of the body; a pair of abrasive tabs at a second end of the body; a slot in the body's mid-section, with the slot containing at least one abrasive surface.

In one embodiment the slot includes two opposing abrasive surfaces. In one embodiment the picking arms include claws. In one embodiment the picking arms include friction pads. In one embodiment the dimensions of the abrasive tabs are configured for a fuse blade size selected from a group consisting of: regular, mini, low-profile mini, micro2, micro3, maxi. In one embodiment the dimensions of the abrasive tabs are configured for a fuse blade type selected from a group consisting of: APR, ATC, ATO, APM, ATM, APS, ATT, APT, ATR, ATL, APX. In one embodiment the picking arms are flexible.

In one embodiment there is a tool for fuses and fuse contacts which includes: a body, with a set of picking arms at a first end of the body; a pair of abrasive tabs at a second end of the body; a slot in the body's mid-section, with the slot containing at least one abrasive surface, a circuit tester in the body.

In one embodiment the circuit tester is configured to test a fuse's continuity. In one embodiment the circuit tester components are comprised of an indicator, a battery, a resistor, and two contact points. In one embodiment the circuit tester components are housed entirely within the body, and further include a battery cap for accessing the battery. In one embodiment the indicator is an LED that is visible on the surface of the body, and which illuminates to indicate continuity across a fuse.

In one embodiment there is a method for extracting and cleaning a fuse and fuse contacts which includes: grasping the fuse with picking arms portion of a tool body and pulling the fuse from a slot, the picking arms positioned at a first end of the tool body; cleaning the fuse's blades on at least one abrasive surface of a slot in the tool body, the slot located in said tool body's mid-section; cleaning fuse contacts with a pair of abrasive tabs, the abrasive tabs positioned at a second end of the tool body.

BRIEF DESCRIPTION OF THE FIGURES

FIG. 1 is a front right perspective view of a first embodiment of the present design, including examples of fuses and fuse receptacles.

FIG. 2 is a front elevation view of a first embodiment of the present design, including examples of fuses and fuse receptacles.

FIG. 2A is a schematic of an optional circuit tester included on an embodiment of the present design.

FIG. 3 is a top view of a first embodiment of the present design.

FIG. 4 is a left end view of a first embodiment of the present design.

FIG. 5 is a right end view of a first embodiment of the present design.

FIG. 6 is a front right perspective view of a second embodiment of the present design, including an example of a fuse.

FIG. 7 is a front elevation view of a second embodiment of the present design.

FIG. 8 is a top view of a second embodiment of the present design.

FIG. 9 is a left end view of a second embodiment of the present design.

FIG. 10 is a right end view of a second embodiment of the present design.

FIG. 13 is a top view of an embodiment of the present design.

FIG. 14 is a left end view of an embodiment of the present design.

FIG. 15 is a right end view of an embodiment of the present design.

FIG. 18 is a top view of an embodiment of the present design.

FIG. 19 is a left end view of an embodiment of the present design.

FIG. 20 is a right end view of an embodiment of the present design.

DETAILED DESCRIPTION OF THE INVENTION

Figure 11:
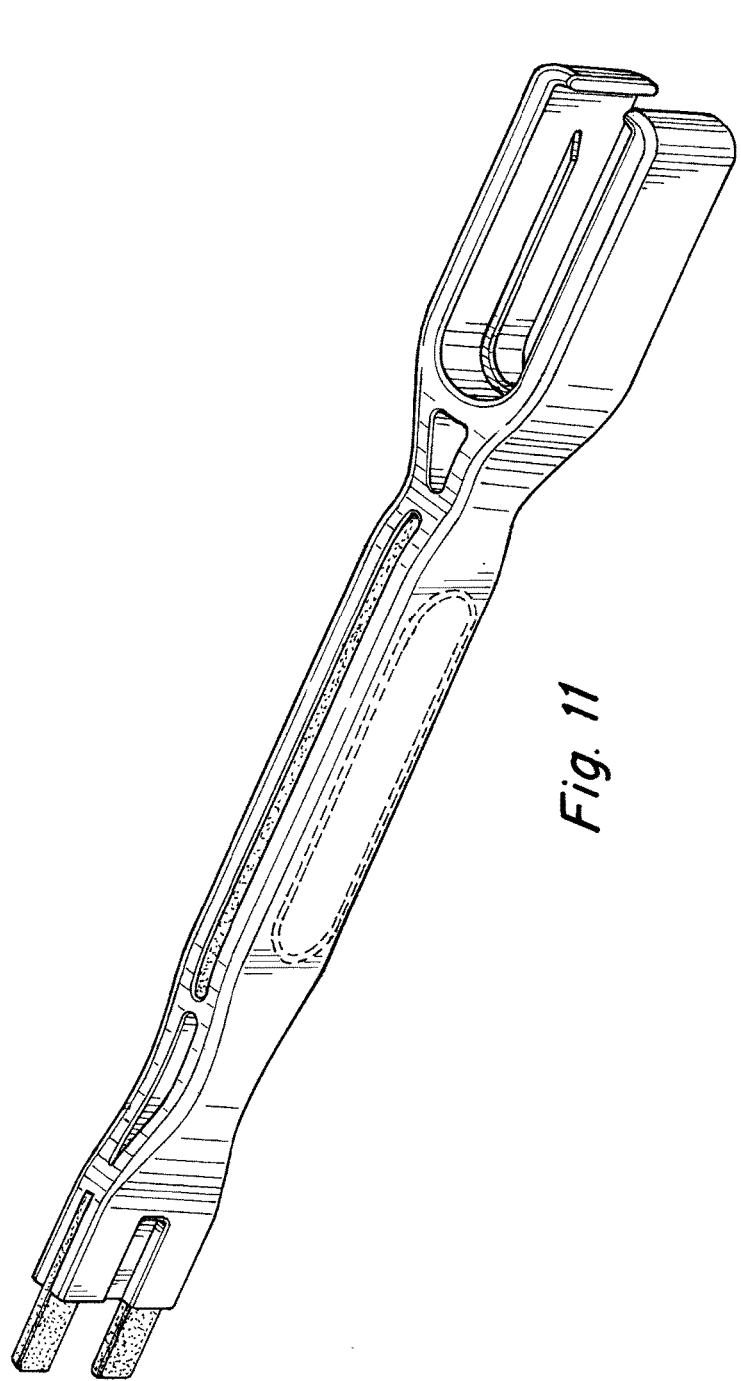
FIG. 11 is a front right perspective view of an embodiment of the present design

A first embodiment of the present design is shown in FIGS. 1-5. A tool body 10, or simply body, includes a set of picking arms 25 at a first end 15 of the body 10. A pair of abrasive tabs 30 re positioned at a second end 20 of the body 10. A slot 35 is included in the body's mid-section 40, with the slot containing at least one abrasive surface. In the preferred embodiment, two opposing abrasive surfaces 45a/45b are included in the slot. Claws 50 curl inward from picking arms 25. Shown are examples of blade-type fuses, such as 60. However, the scope of the present application is not limited by the graphical representation of the fuses shown.

The tool is used, not necessarily in the order described herein, to remove a blade-type fuse such as 60 from a fuse receptacle. This is done by grasping the fuse with picking arms 25, for which claws 50 are adapted to provide additional grip around the top t-shaped portion of a fuse such as 60. The fuse is then pulled from the fuse receptacle, where the fuse receptacle is configured with female-type slots and includes fuse contacts 65.

With a fuse removed, the tool includes further features to remove or reduce oxidation and corrosion on the electrical contact points of the fuse's blades, and the fuse receptacle contact points. As shown in FIG. 2, the blades of a fuse such as 60 may be placed into slot 35, which includes at least one abrasive surface, and preferably two opposing abrasive surfaces 45a and 45b. The fuse is then moved in a back and forth motion in the slot, allowing the abrasive surfaces to remove oxidation from the surfaces of the fuse's blades.

Similarly, the tool includes a pair of abrasive tabs 30, preferably located at the opposing end of body 10 from picking arms 25. After preferably taking precautions to turn-off power to the circuit, abrasive tabs 30 may be inserted into the slots of a fuse receptacle, where fuse contacts 65 are housed. The tool is then moved in a back and forth motion in the slots, allowing the abrasive surfaces of tabs 30 to remove oxidation from the surfaces of fuse contacts 65.

In another embodiment of the present system as seen in FIGS. 6-10, the tool is of a slightly different configuration, suited for "mini" type blade fuses. Mini body 210 includes mini picking arms 225 include a narrower shaped end, which is adapted for "mini" type fuses 260, which is explained further below. First mini end 215, second mini end 220, and mid-section 240 are shown. This embodiment uses friction pads 255 on the inside tips of mini picking arms 225. The friction pads may be in the form of ridges that are molded as part of the overall body, or may be pads of a different material that is affixed to the body. This embodiment also includes a mini slot 235 with at least one abrasive surface for mini fuses 245a, with optional second abrasive surface 245b, and mini abrasive tabs 230. Here, the abrasive tabs are configured as insertable to a "mini" type female fuse receptacle.

An additional feature which may be optionally included is a circuit tester, preferably positioned in the body 10. The circuit components may include an indicator 72, which in the preferred embodiment is an LED; a battery 74; a resistor 76; and two contact points 70. The circuit components may be imbedded in the body 10, with the contact points 70 appropriately spaced for a particular size of blade-type fuse.

A battery cap may be included, for removable access to the battery 74 and to hold and conceal the battery 74 in body 10. The blades of a fuse may be placed across contact points 70, allowing a user to determine if the fuse has continuity.

Of course, other suitable circuits that provide testing may also be used, with the circuit and components shows merely serving as examples. Similarly, other types of contact points, such as a configuration using slots into which the fuse blades may slide, may also be used. The circuit tester may be located at any suitable position on body 10, and is not limited to the position shown. The circuit tester may be included in any embodiment of the present system, and for brevity it is shown only in the first embodiment.

A tool may be configured, in particular the dimensions and spacing of abrasive tabs 30, for optimal use with a particular fuse blade size, and/or fuse blade type. Industry standards describe fuse blade size according to: regular, mini, low-profile mini, micro2, micro3, maxi. Industry standards describe fuse blade type according to: APR, ATC, ATO, APM, ATM, APS, ATT, APT, ATR, ATL, APX. A single tool may be configured in regard to the dimensions of abrasive tabs 30, and/or the dimensions of slot 35, and/or the dimensions of picking arms 25, and/or whether picking arms 25 use a claws 50 and/or pads 255, for the for use with a specific type of fuse. A single tool may be compatible with multiple types of fuses, where the different types of fuses have similar dimensions.

Preferably, the tool is made from a suitable type of plastic, through suitable means know in the art such as injection molding, 3-dimensional printing, etc. The abrasive surfaces may be part of the tool's base material, or may be a separate abrasive material that is attached to the tool in the specific locations where abrasive material in used. The material used allows picking arms 25 to be flexible, and capable of being squeezed around a fuse in manner that allows a fuse to be removed from its receptacle.

Figure 12:
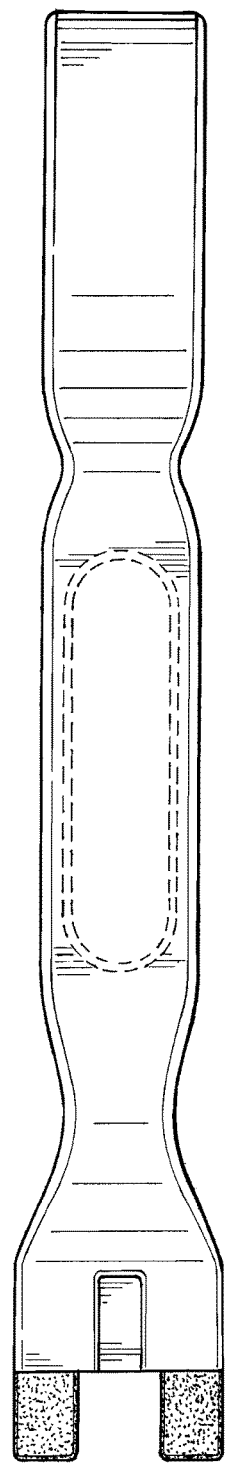
FIG. 12 is a front elevation view of an embodiment of the present design
Figure 16:
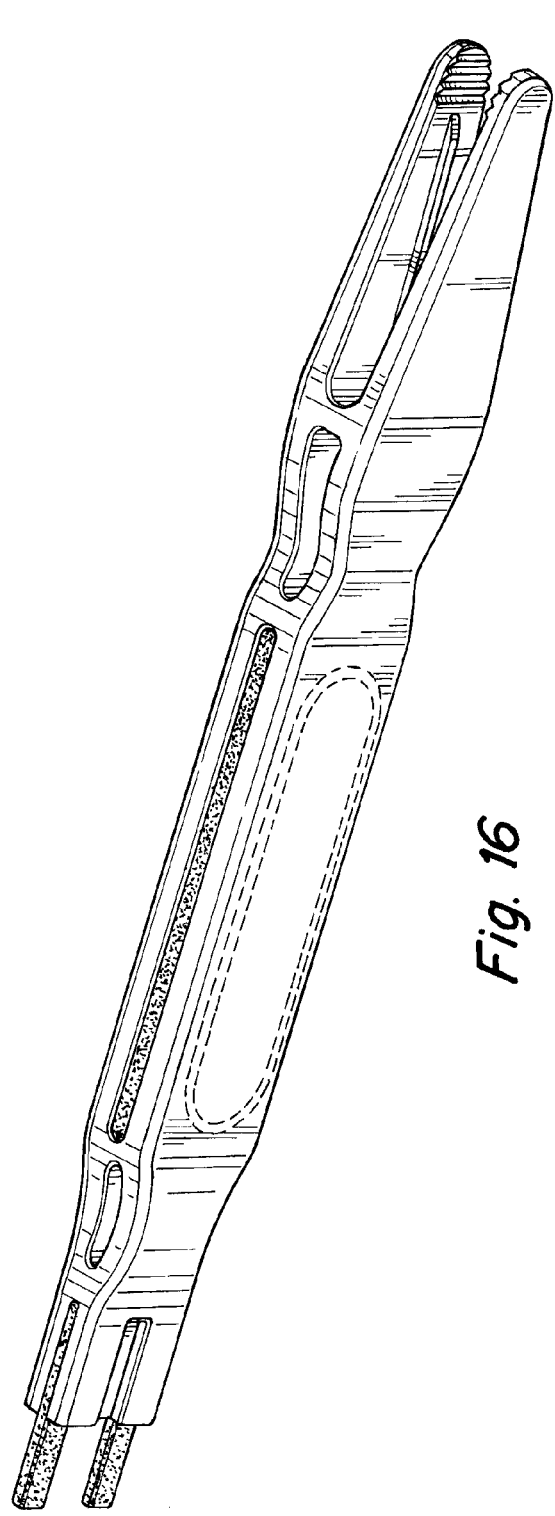
FIG. 16 is a front right perspective view of an embodiment of the present design
Figure 17:
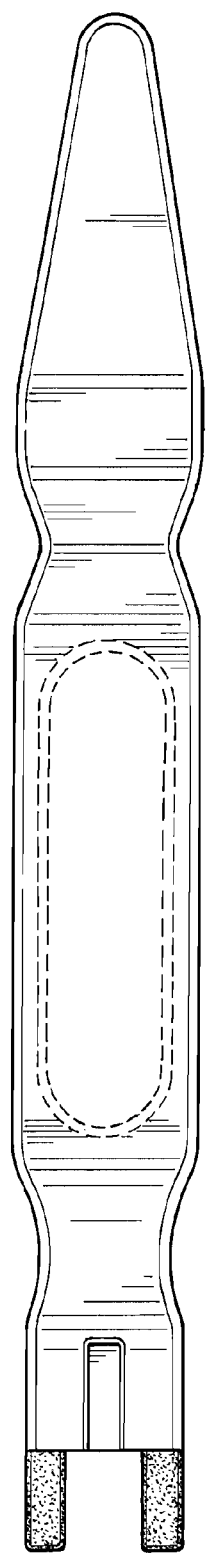
FIG. 17 is a front elevation view of an embodiment of the present design

FIGS. 11-20 show additional views of embodiments of the present system.

Although the presently disclosed design has been described with respect to one or more embodiments, it will be understood that other embodiments of the present design may be made without departing from the spirit and scope of the present design. Hence, 160 the present design is deemed limited only by the appended claims and the reasonable interpretation thereof.

What is claimed:

1. A tool for fuses and fuse contacts, comprising:
   a body, with a set of picking arms at a first end of the body;
   a pair of abrasive tabs at a second end of the body; and
   a slot in the body's mid-section, with the slot containing at least one abrasive surface for abrading and cleaning surfaces of a fuse's blades and where the slot's width is sufficient to accept fuses of different sizes.

2. The tool of claim 1, in which the slot includes two opposing abrasive surfaces, and where the slot's width allows the fuse to be abraded and cleaned by moving the fuse in a back-and-forth motion parallel to the body's length.

3. The tool of claim 1, in which the picking arms include claws.

4. The tool of claim 1, in which the picking arms include friction pads.

5. The tool of claim 1, in which dimensions of the abrasive tabs are configured for a fuse blade size selected from a group consisting of: regular, mini, low-profile mini, micro2, micro3, maxi.

6. The tool of claim 1, in which dimensions of the abrasive tabs are configured for a fuse blade type selected from a group consisting of: APR, ATC, ATO, APM, ATM, APS, ATT, APT, ATR, ATL, APX.

7. The tool of claim 1, in which the picking arms are flexible.

8. A tool for fuses and fuse contacts, comprising:
a body, with a set of picking arms at a first end of the body;
a pair of abrasive tabs at a second end of the body;
a slot in the body's mid-section, with the slot containing at least one abrasive surface for abrading and cleaning surfaces of a fuse's blades and where the slot's width is sufficient to accept fuses of different sizes; and
a circuit tester in the body.

9. The tool of claim 8, in which the circuit tester is configured to test a fuse's continuity.

10. The tool of claim 8, in which the circuit tester components are comprised of an indicator, a battery, a resistor, and two contact points.

11. The tool of claim 10, in which the circuit tester components are housed entirely within the body, and further includes a battery cap for accessing the battery.

12. The tool of claim 10, in which the indicator is an LED that is visible on the body's surface, and which illuminates to indicate continuity across a fuse.

13. A method for extracting and cleaning a fuse and fuse contacts, comprising:
grasping the fuse with picking arms portion of a tool body and pulling the fuse from a slot, the picking arms positioned at a first end of the tool body;
cleaning the fuse's blades on at least one abrasive surface of a slot in the tool body, the slot located in said tool body's mid-section, where the slot's width is sufficient to accept fuses of different sizes; and
cleaning fuse contacts with a pair of abrasive tabs, the abrasive tabs positioned at a second end of the tool body.

14. The method of claim 13, in which the slot includes two opposing abrasive surfaces, and where the slot's width allows the fuse to be abraded and cleaned by moving the fuse in a back-and-forth motion parallel to the body's length.

15. The method of claim 13, in which the picking arms include claws.

16. The method of claim 13, in which the picking arms include friction pads.

17. The method of claim 13, in which dimensions of the abrasive tabs are configured for a fuse blade size selected from a group consisting of: regular, mini, low-profile mini, micro2, micro3, maxi.

18. The method of claim 13, in which dimensions of the abrasive tabs are configured for a fuse blade type selected from a group consisting of: APR, ATC, ATO, APM, ATM, APS, ATT, APT, ATR, ATL, APX.

19. The method of claim 13, in which said picking arms are flexible.

* * * * *